US007259381B2

(12) United States Patent
Liu et al.

(10) Patent No.: US 7,259,381 B2
(45) Date of Patent: Aug. 21, 2007

(54) METHODOLOGY FOR DETERMINING ELECTRON BEAM PENETRATION DEPTH

(75) Inventors: Josephine J. Liu, Sunnyvale, CA (US); Alexandros T. Demos, Pleasanton, CA (US); Hichem M'Saad, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 471 days.

(21) Appl. No.: 11/006,305

(22) Filed: Dec. 6, 2004

(65) Prior Publication Data

US 2006/0027764 A1 Feb. 9, 2006

Related U.S. Application Data

(60) Provisional application No. 60/598,860, filed on Aug. 3, 2004.

(51) Int. Cl.
*G21K 5/10* (2006.01)
(52) U.S. Cl. .................... 250/492.22; 250/370.02; 250/370; 250/397; 257/429; 257/430; 438/56; 438/57
(58) Field of Classification Search ...................... None
See application file for complete search history.

(56) References Cited

U.S. PATENT DOCUMENTS

| | | | |
|---|---|---|---|
| 4,905,170 A | 2/1990 | Forouhi et al. | |
| 5,362,526 A | 11/1994 | Wang | |
| 6,080,526 A | 6/2000 | Yang et al. | |
| 6,541,367 B1 | 4/2003 | Mandal | |
| 6,603,120 B2 | 8/2003 | Yamashita | |

FOREIGN PATENT DOCUMENTS

WO    WO99/41423    8/1999

OTHER PUBLICATIONS

MTS, Fast, Economical—New Nano Indenter XPW, MTS Systems Corporation, 2001, Eden Prairie, MN, pp. 1-2.

(Continued)

*Primary Examiner*—Jack I. Berman
*Assistant Examiner*—Zia R. Hashmi
(74) *Attorney, Agent, or Firm*—Townsend and Townsend and Crew

(57) ABSTRACT

The Grunn equation:

$$\text{Depth} = \frac{0.046 \, (V_{acc})^n}{\rho}$$

is modified to accurately predict depth of electron beam penetration into a target material. A two-layer stack is formed comprising a thickness of the target material overlying a detection material exhibiting greater sensitivity to the electron beam than the target material. The target material is exposed to electron beam radiation of different energies, with the threshold energy resulting in a changed physical property of the detection material below a predetermined value marking a penetration depth corresponding to the target material thickness. Utilizing the threshold energy ($V_{acc}$), the target material thickness (Depth), and the known target material density ($\rho$), the numerical power "n" of the Grunn equation is calculated to fit experimental results. So modified, the Grunn equation accurately predicts the depth of penetration of electron beams of varying energies into the target material.

22 Claims, 11 Drawing Sheets

OTHER PUBLICATIONS

N&K, N&K Trench Measurement Method Gains Industry Acceptance Multiple 3000TMS in Use Worldwide, www.nandk.com/pressevents/pressreleases/Apr. 21, 2003.html, printed Mar. 23, 2004.

Demos et al., "Thermally Stable, k<2.5 Carbon-Doped Oxide Film Deposited by a Plasma-Enhance CVD Process," [abstract], Applied Materials, Santa Clara, CA, USA, May 11, 2004, 1 page total.

Demos et al., "A Thermally Stable, k<2.5 Carbon-Doped Oxide Film Deposited by a Plasma-Enhance CVD Process," Microsoft Power Point presentation, Applied Materials, Santa Clara, CA, USA, May 11, 2004, 21 pages total.

Dixit et al., "Film Properties and Integration Performance of a Nano-Porous Carbon Doped Oxide," Applied Materials, Santa Clara, CA, USA, May 11, 2004, 3 pages total.

Dixit et al., "Film Properties and Integration Performance of a Nano-Porous Carbon Doped Oxide," Microsoft Power Point presentation, Applied Materials, Santa Clara, CA, USA, May 11, 2004, 22 pages total.

METHODOLOGY FOR DETERMINING ELECTRON BEAM PENETRATION DEPTH

CROSS REFERENCES TO RELATED APPLICATIONS

The instant U.S. nonprovisional patent application claims priority to U.S. provisional patent application No. 60/598,860, filed Aug. 3, 2004 and incorporated by reference herein for all purposes.

BACKGROUND OF THE INVENTION

One of the primary steps in the fabrication of modern semiconductor devices is the formation of metal and dielectric films on a substrate by chemical reaction of gases. Such deposition processes are referred to as chemical vapor deposition or CVD. Conventional thermal CVD processes supply reactive gases to the substrate surface where heat-induced chemical reactions take place to produce a desired film. The high temperatures at which some thermal CVD processes operate can damage device structures having layers previously formed on the substrate. A preferred method of depositing metal and dielectric films at relatively low temperatures is plasma-enhanced CVD (PECVD) techniques such as described in U.S. Pat. No. 5,362,526, entitled "Plasma-Enhanced CVD Process Using TEOS for Depositing Silicon Oxide", which is incorporated by reference herein. Plasma-enhanced CVD techniques promote excitation and/or disassociation of the reactant gases by the application of radio frequency (RF) energy to a reaction zone near the substrate surface, thereby creating a plasma of highly reactive species. The high reactivity of the released species reduces the energy required for a chemical reaction to take place, and thus lowers the required temperature for such PECVD processes.

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 µm and even 0.25 µm feature sizes, and tomorrow's plants soon will be producing devices having even smaller geometries.

In order to further reduce the size of devices on integrated circuits, it has become necessary to use conductive materials having low resistivity and insulators having low k (dielectric constant <2.5) to reduce the capacitive coupling between adjacent metal lines. Liner/barrier layers have been used between the conductive materials and the insulators to prevent diffusion of byproducts such as moisture onto the conductive material as described in International Publication Number WO 99/41423, published on Aug. 17, 1999. For example, moisture that can be generated during formation of a low k insulator readily diffuses to the surface of the conductive metal and increases the resistivity of the conductive metal surface. A barrier/liner layer formed from organosilicon or organosilane nitride materials can block the diffusion of the byproducts. However, the barrier/liner layers typically have dielectric constants that are greater than about 2.5, and the high dielectric constants result in a combined insulator that may not significantly reduce the dielectric constant.

FIGS. 1A-1E illustrates a three-layer deposition PECVD process for depositing a PECVD lining layer 2 of the oxidized organosilane or organosiloxane polymer as described in International Publication Number WO 99/41423. The lining layer 2 acts as an isolation layer between a subsequent layer 7 and the underlying substrate surface 6 and metal lines 8, 9, 10 formed on the substrate surface. The layer 7 is capped by a PECVD capping layer 12 of the oxidized organosilane or organosiloxane polymer. The PECVD process deposits a multi-component dielectric layer, wherein an carbon containing silicon dioxide ($SiO_2$) is first deposited on the patterned metal layer having metal lines 8, 9, 10 formed on substrate 6.

Referring to FIG. 1A, the PECVD lining layer 2 is deposited by the plasma enhanced reaction of an organosilane or organosiloxane compound such as methylsilane, $CH_3SiH_3$, and an oxidizing gas such as $N_2O$ in the presence of an inert gas, such as argon, at a temperature of approximately −20° C. to 40° C. The oxidized organosilane or organosiloxane layer is then cured. The deposited PECVD lining layer 2 (at about 2000 Å per minute) has improved barrier characteristics for the subsequent deposition of the layer 7 shown in FIG. 1B. The lining layer obtained from methylsilane has sufficient C—H bonds to be hydrophobic, and is an excellent moisture barrier. A low K dielectric layer 7 is then deposited on the liner layer 2 by the reaction of a silane compound and hydrogen peroxide ($H_2O_2$) at a temperature below 200° C. at a pressure of about 0.2 to about 5 Torr during deposition of the layer 7. The layer 7 may be partially cured as shown in FIG. 1C to remove solvents such as water prior to deposition of a cap layer 12 as shown in FIG. 1D. Curing is performed by pumping down a reaction under an inert gas atmosphere under 10 Torr.

Conventional liner layers, such as silicon nitride (SiN), have higher dielectric constants than silicon oxides, and the combination of low k dielectric layers with high k dielectric liner layers provides little or no improvement in the overall stack dielectric constant and capacitive coupling. Referring to FIG. 1D, after deposition of the layer 7, an optional capping layer 12 may be deposited on the low k dielectric layer 7 by the plasma enhanced reaction of an organosilane or organosiloxane compound and an oxidizing gas such as $N_2O$. Referring to FIG. 1E, after deposition of the capping layer, if any, the deposited layers are cured in a furnace or another chamber to drive off remaining solvent or water. The capping layer 12 is also an oxidized organosilane or organosiloxane film that has good barrier properties and has a dielectric property of about 3.0. Both the liner layer 2 and the cap layer 12 have a dielectric constant greater than 3.0 and the high dielectric constant layers substantially detract from the benefit of low k dielectric layer 7.

As devices get smaller, liner layers and cap layers having relatively high dielectric constants contribute more to the overall dielectric constant of a multi-component dielectric layer. Additionally, the smaller device geometries result in an increase in parasitic capacitance between devices. Parasitic capacitance between metal interconnects on the same or adjacent layers in the circuit can result in crosstalk between the metal lines or interconnects and/or resistance-capacitance (RC) delay, thereby reducing the response time of the device and degrading the overall performance of the device. The effects of parasitic capacitance between metal interconnects on the same or adjacent layers in the circuit is especially of concern as the current state of the art circuits can employ 4 to 5 levels of interconnection, while next generation devices may require 6, 7, or possibly 8 levels of interconnection.

Lowering the parasitic capacitance between metal interconnects separated by dielectric material can be accomplished by either increasing the thickness of the dielectric material or by lowering the dielectric constant of the dielectric material. Increasing the thickness of the dielectric materials, however, does not address parasitic capacitance within the same metallized layer or plane. As a result, to reduce the parasitic capacitance between metal interconnects on the same or adjacent layers, one must change the material used between the metal lines or interconnects to a material having a lower dielectric constant than that of the materials currently used, i.e., k≈3.0.

Therefore, there remains a need for dielectric layers having dielectric constants below about 2.5 with good adhesion properties.

SUMMARY OF THE INVENTION

According to embodiments of the present invention, the power "n" of the Grunn equation may be modified to fit experimental results revealing depth of electron beam penetration. Specifically, a two-layer stack is formed comprising a thickness of the target material overlying a detection material exhibiting greater sensitivity to the electron beam than the target material. The target material is exposed to electron beam radiation of different energies, with a threshold energy resulting in a changed physical property of the detection material marking an actual penetration depth corresponding to the target material thickness. Utilizing the observed penetration depth, the threshold energy, and the known target material density, a numerical power "n" of the Grunn equation is calculated. As modified to match experimental observation, the Grunn equation accurately predicts the depth of penetration into the target material of electron beams of varying energies.

An embodiment of a method of determining a depth of penetration of an electron beam into a target material, comprises, providing an electron beam source, and providing a layer of a detection material exhibiting a first sensitivity of a physical property in response to electron beam radiation. A layer of the target material of a first thickness is provided in contact with the detection material and positioned proximate to the electron beam source, the target material exhibiting a second, reduced sensitivity of the physical property in response to electron beam radiation. The electron beam radiation is directed at a first energy into the target material. A change in the physical property of the detection material is detected to mark an observed electron beam penetration depth of the first thickness.

A method of predicting depth of penetration of an electron beam into a target material, comprises, providing a thickness of a target material layer in contact with a detection material layer and positioned proximate to the electron beam source, the target material exhibiting a second, reduced sensitivity of a physical property in response to electron beam radiation. The target material is successively irradiated with electron beam radiation of increasing energies. A threshold energy of the applied electron beam radiation resulting in a change of the physical property of the detection layer below a predetermined value, is identified. A numerical power (n) of the Grunn Equation:

$$\text{Depth} = \frac{0.046 \ (V_{acc})^n}{\rho}$$

is calculated based upon the density (ρ), the threshold energy (Vacc), and the thickness (Depth). The Grunn Equation is utilized with the calculated numerical power (n) to predict a second depth of penetration into the target material of an electron beam of a second energy.

An embodiment of a composition in accordance with the present invention for indicating depth of penetration of an electron beam, comprises, a detection material exhibiting a first sensitivity of a physical property in response to an electron beam radiation exposure dosage. The composition further comprises a target material in contact with the detection material and positioned proximate to a source of electron beam radiation, the target material exhibiting a second, reduced sensitivity of the physical property in response to the electron beam radiation exposure dosage.

An embodiment of a computer-readable storage medium in accordance with the present invention has embodied thereon, a computer-readable program for directing operation of a host computer including a communications system, a processor, and a storage device. The computer-readable program includes instructions for operating the host computer to calculate a numerical power n of a Grunn Equation in accordance with the following: receiving a thickness (Depth) of a target material in contact with a detection material and positioned proximate to the electron beam source, the target material exhibiting a reduced sensitivity of a physical property in response to electron beam radiation; receiving a density (ρ) of the target material; receiving a threshold energy of applied electron beam radiation (Vacc) resulting in a change of a physical property of a detection layer below a predetermined value; and calculating a numerical power (n) of the Grunn Equation:

$$\text{Depth} = \frac{0.046 \ (V_{acc})^n}{\rho}$$

based upon the density, the threshold energy, and the thickness.

These and other objects and features of the present invention and the manner of obtaining them will become apparent to those skilled in the art, and the invention itself will be best understood by reference to the following detailed description read in conjunction with the accompanying drawings.

DETAILED DESCRIPTION OF THE INVENTION

Figure 1A:
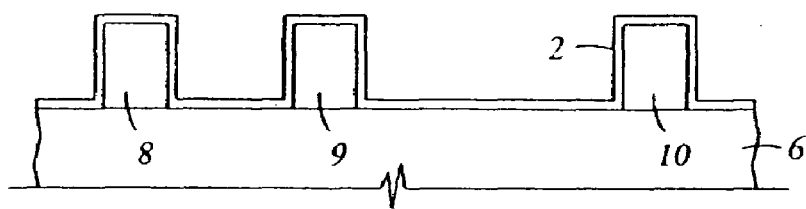
FIGS. 1A-E show simplified cross-sectional views of the steps of forming a stack of dielectric layers.
Figure 1B:
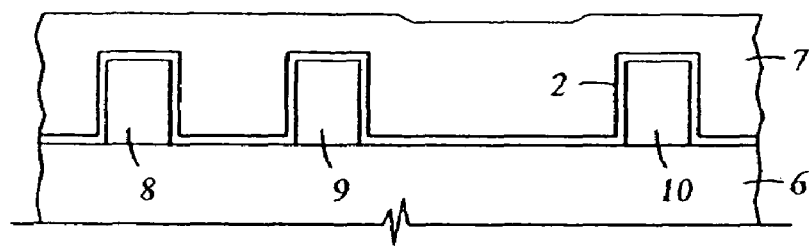
Figure 1C:
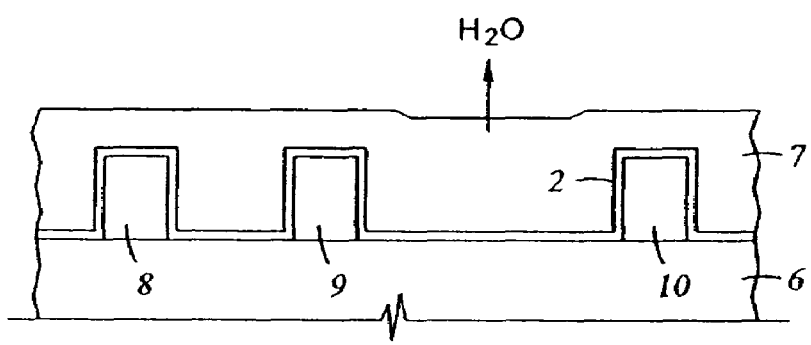
Figure 1D:
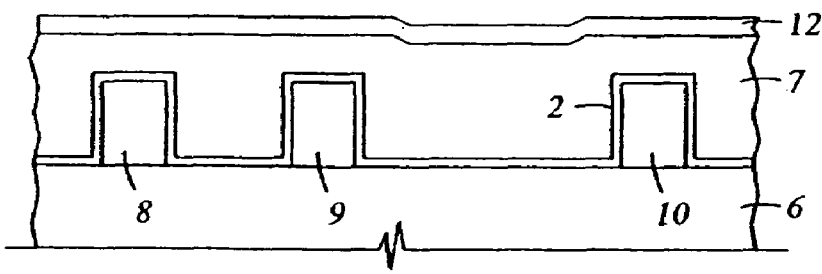
Figure 1E:
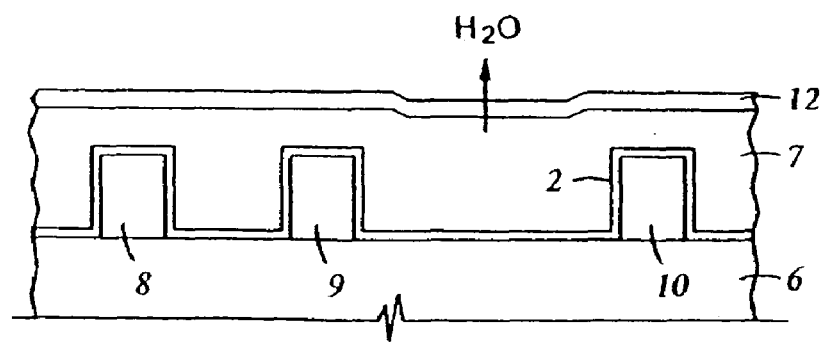

The application of electron beam radiation for processing of materials has proven useful for a number of different applications. In many of those applications, the electron beam is applied to induce a chemical or physical transformation in the material receiving the radiation.

In such applications, the magnitude or character of the chemical or physical transformation at various depths into the irradiated material may depend upon the intensity of the electron beam radiation received. Different materials exhibit varying permeability to the applied electron beam radiation, making accurate prediction of the dose received by subsurface regions difficult. In addition, the intensity of radiation received at subsurface regions is dependent upon a number of factors, including energy and dosage of the applied beam Theoretical e-beam penetration depth is typically determined using the Grunn equation (I) reproduced below:

$$\text{Depth} = \frac{0.046 \ (V_{acc})^n}{\rho}, \quad (I)$$

where:
Depth=electron beam penetration depth;
$V_{acc}$=cathode voltage;
n=numerical power; and
ρ=density of material receiving applied beam.

According to embodiments of the present invention, the power "n" of the Grunn equation may be modified to fit experimental results revealing depth of electron beam penetration. Specifically, a two-layer stack is formed comprising a thickness of the target material overlying a detection material exhibiting greater sensitivity to the electron beam than the target material. The target material is exposed to electron beam radiation of different energies, with the threshold energy resulting in a changed physical property of the detection material marking an actual penetration depth of the target material thickness. Utilizing the observed penetration depth, the threshold energy, and the known target material density, a numerical power "n" of the Grunn equation is calculated. As modified to match experimental observation, the Grunn equation accurately predicts depth of penetration into the target material of electron beams of varying energies.

In order to illustrate an example of an embodiment of a method in accordance with the present invention, a two layer stack of dielectric materials was subjected to E-beam irradiation, and actual depth of penetration of the e-beam radiation was compared to predicted values. Specifically, a detection layer of carbon-doped silicon oxide dielectric material having a thickness of 4500 Å was formed by a first method. Next, a target layer of carbon-doped silicon oxide dielectric material having a thickness of 5000 Å was formed over the detection layer utilizing a different method, chemical vapor deposition (CVD).

This two-layer thin film stack was then exposed to processing runs under different conditions, and experienced film shrinkage as summarized in TABLE 1 below:

TABLE 1

| Run # | E-Beam Energy (keV) | E-Beam Dose (μC/cm²) | Layer | Film Thickness (Å) | | Shrinkage (%) | Predicted Depth of E-Beam Penetration at Power "n" of Grunn Equation (Å) | |
|---|---|---|---|---|---|---|---|---|
| | | | | Pre-Treat. | Post-Treat. | | n = 1.75 | n = 1.9 |
| 1* | 0 | 0 | top | 4952 | — | — | — | |
| | | | bottom | 4583 | | | | |
| 2• | 0 | 0 | top | 4952 | 4948 | 0.1% | — | |
| | | | bottom | 4470 | 4467 | 0.03% | | |
| 3• | 3 | 100 | top | 5110 | 4847 | 5.2% | 2458 | 2898 |
| | | | bottom | 4608 | 4589 | 0.4% | | |
| 4• | 4 | 100 | top | 4905 | 4499 | 8.3% | 4066 | 5006 |
| | | | bottom | 4588 | 4508 | 1.7% | | |
| 5• | 4.5 | 100 | top | 5072 | 4541 | 10.5% | 4997 | 6261 |
| | | | bottom | 4507 | 4396 | 2.5% | | |
| 6• | 6 | 100 | top | 4948 | 4385 | 11.4% | 8266 | 10815 |
| | | | bottom | 4469 | 4217 | 5.6% | | |
| 7• | 4.5 | 500 | top | 4968 | 3678 | 26.0% | 4997 | 6261 |
| | | | bottom | 4559 | 4370 | 4.2% | | |

*as-deposited only; no lamp heating at 400° C.
•lamp heating at 400° C.

The results of TABLE 1 were obtained utilizing the n&k Analyzer 2000 available from n&k Technology, Inc., of Santa Clara, Calif. This apparatus allows determination of the thickness of two or more films formed on a substrate. For films formed on Si substrates, the device uses the measurement of reflectance, R, to determine both the thickness and the index of refraction (RI). The reflectance is measured near-normal incidence at a fixed angle of about 5°. Both visible and UV light sources are employed so the measured wavelength range covers from 190 to 1000 nm.

Figure 3:
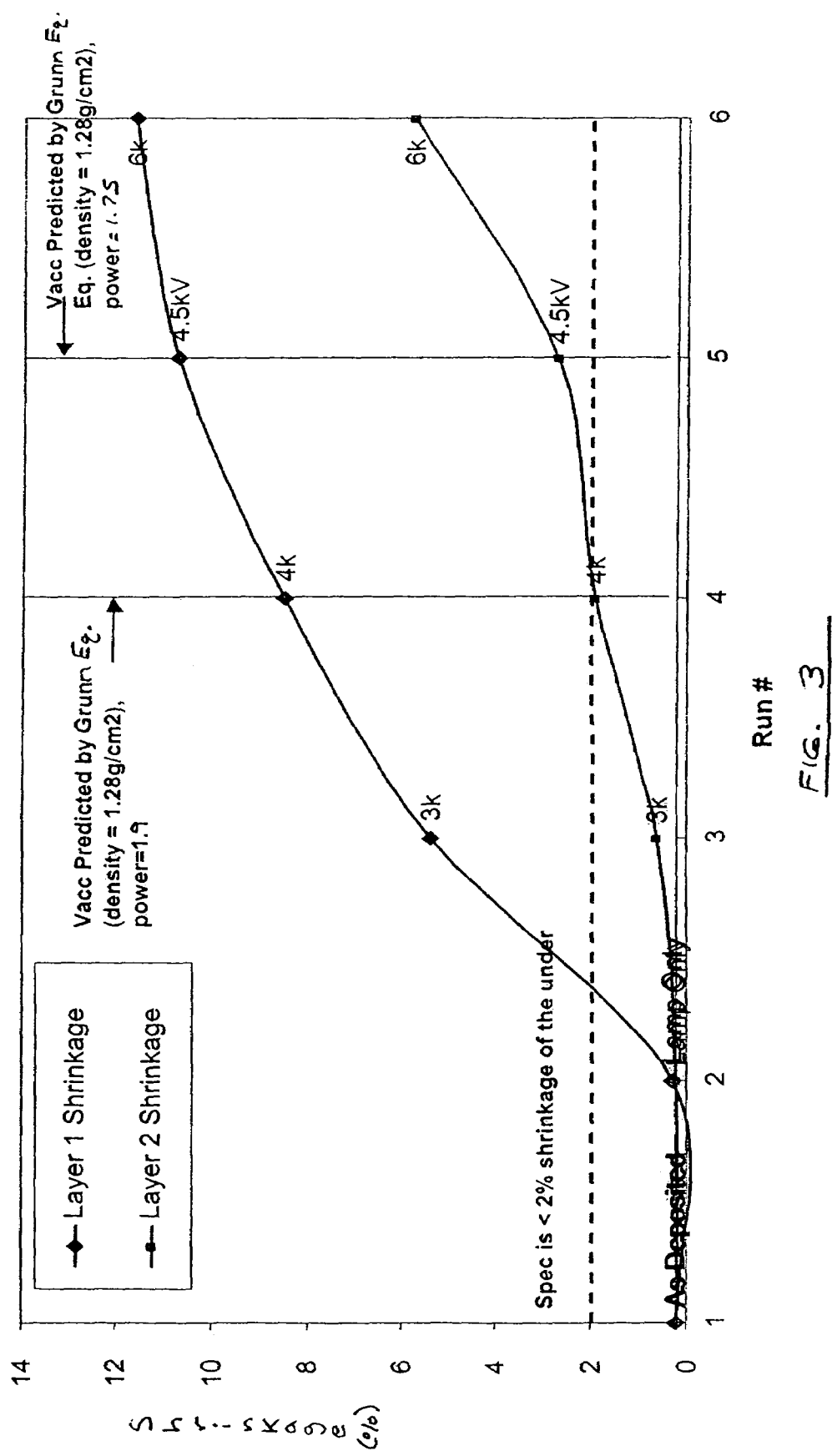
FIG. 3 plots shrinkage for each layer of two-layer dielectric stacks subjected a variety of different post-deposition processing runs.

The film shrinkage data of TABLE 1 is also plotted in FIG. 3. TABLE 1 and FIG. 3 both illustrate that film thickness data obtained from experimental e-beam irradiation can be used to modify the Grunn equation to more accurately predict the depth of e-beam penetration.

For example, in calculating depth of electron beam penetration into organic photoresist material, a power n=1.75 has conventionally been employed in the Grunn Equation. Such a conventional Grunn equation predicted that an applied cathode voltage ($V_{acc}$) of 4.5 keV would result in penetration of the electron beam radiation to a depth of ~5000 Å (4996.54 Å) in CVD carbon-doped silicon oxide material having of density of 1.28 g/cm². However, under an applied $V_{acc}$ of 4.5 keV, the underlying spun-on layer was actually observed to exhibit a shrinkage of 2.5%, exceeding a 2% predetermined maximum value.

Based upon the experimental results obtained regarding film shrinkage, the Grunn Equation was modified to more accurately predict e-beam penetration. In particular, the EXEL® spreadsheet program available from Microsoft Corporation of Redmond, Wash., was utilized to re-calculate the predicted e-beam penetration depth to match the experimental data by trying different values for the numerical power "n" in the Grunn equation. However, the present invention is not limited to use of this, or any other specific method for fitting experimental data to the Grunn Equation.

Grunn equation modified with n=1.9 predicted that an applied threshold cathode voltage ($V_{acc}$) of only 4 keV would result in penetration of the electron beam radiation to a depth of ~5000 Å (5005.67 Å) in the CVD carbon-doped silicon oxide target material having of density of 1.28 g/cm². In agreement with this prediction, under an applied threshold energy $V_{acc}$ of 4 keV, the underlying spun-on detection layer was actually observed to exhibit a shrinkage of 1.7%, within the 2% predetermined maximum value.

Figure 4:
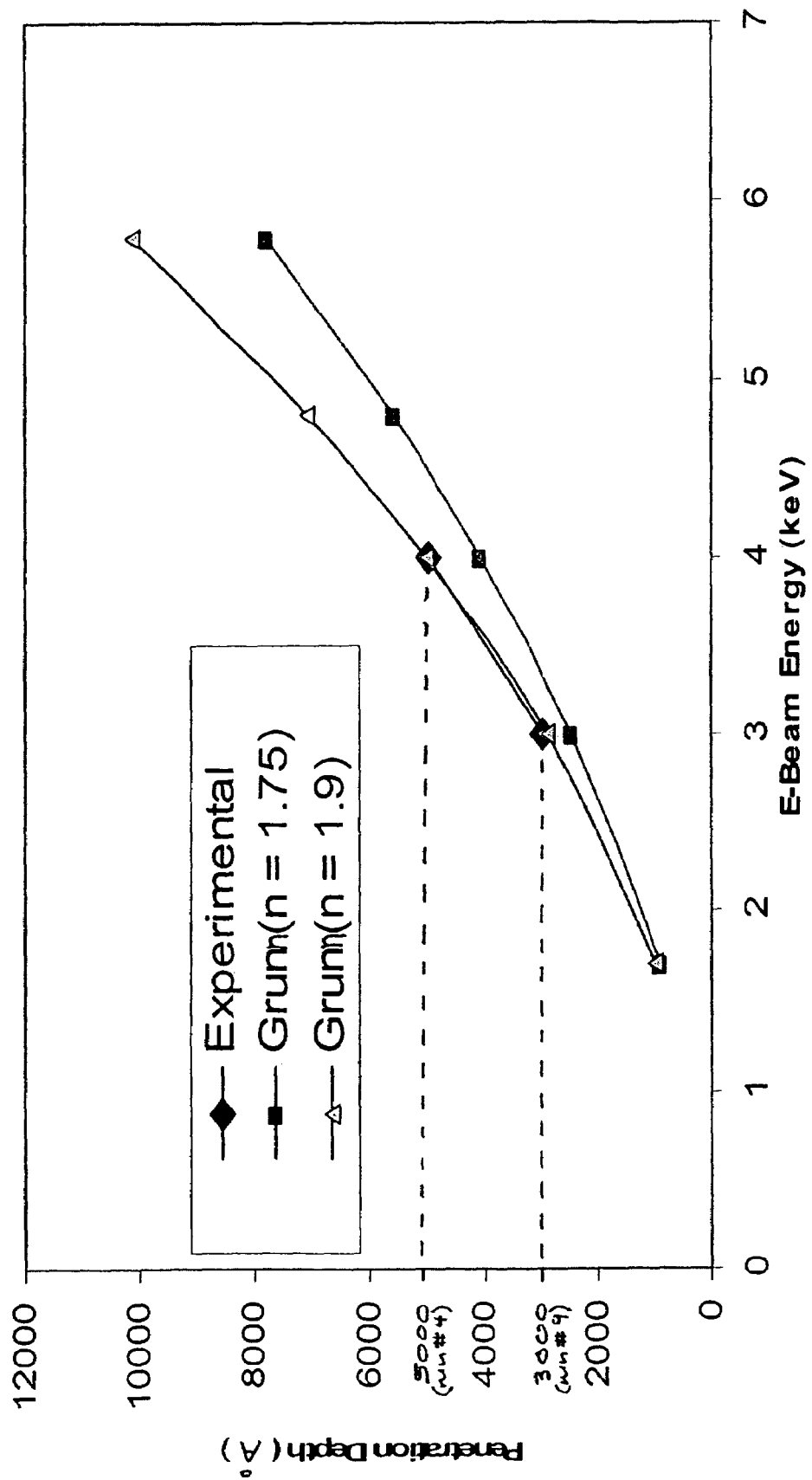
FIG. 4 plots predicted and observed electron beam penetration depth for a variety of different post-deposition processing runs.

FIG. 4 plots e-beam penetration depth versus e-beam energy, as predicted by the conventional Grunn equation having a power n=1.75, and also as predicted by the modified Grunn equation having a power n=1.9. As discussed above, optimal experimentally observed run #4 of TABLE 1 lies along the plot predicted by the modified Grunn Equation.

In order to verify the improved accuracy of prediction of the modified Grunn equation, a second set of experiments was performed. Specifically, a different two-layer stack of target and detection materials was subjected to E-beam irradiation, and the observed depth of penetration compared to predicted values. Specifically, a detection layer of carbon-doped silicon oxide dielectric material having a thickness of 4500 Å was formed by the same method as in the previous example. Next, a target layer of CVD carbon-doped silicon oxide of thickness of 3000 Å was formed over the detection layer.

This thin film stack was next exposed to processing runs exhibiting different conditions, and experienced film shrinkage as summarized in TABLE 2 below:

TABLE 2

| Run # | E-Beam Energy (keV) | E-Beam Dose (µC/cm²) | Layer | Film Thickness (Å) | | | Predicted Depth of E-Beam Penetration at Power "n" of Grunn Equation (Å) | |
|---|---|---|---|---|---|---|---|---|
| | | | | Pre-Treat. | Post-Treat. | Shrinkage (%) | n = 1.75 | n = 1.9 |
| 8 | 2.5 | 100 | top | 3015 | 2811 | 6.8% | 1786 | 2049 |
| | | | bottom | 4593 | 4542 | 1.1% | | |
| 9 | 3 | 100 | top | 3087 | 2799 | 9.3% | 2456 | 2898 |
| | | | bottom | 4496 | 4420 | 1.7% | | |
| 10 | 3.5 | 100 | top | 3011 | 2683 | 10.9% | 3219 | 3884 |
| | | | bottom | 4601 | 4445 | 3.4% | | |
| 11 | 3 | 500 | top | 3058 | 2410 | 21.2% | 2456 | 2898 |
| | | | bottom | 4579 | 4453 | 2.7% | | | all runs with lamp heating at 400° C.

In accordance with alternative embodiments of the present invention, other approaches including different software programs could be utilized to provide an optimal fit between the numerical power "n" of the Grunn equation, the known density of the target material, the experimentally observed penetration depth, and the corresponding threshold cathode voltage. As described below, embodiments in accordance with the instant invention could include a computer readable storage medium having recorded thereon code for receiving experimentally observed penetration depths corresponding to different cathode voltages and target material of varying thicknesses and densities, and fitting the numerical power "n" of the Grunn Equation thereto.

A range of values of n over the range from 1.85 to 1.95 were plotted. Modification of the Grunn Equation to utilize a power n=1.9 substantially improved the accuracy of the predicted depth of electron beam penetration. Specifically, a TABLE 2 confirms the improved accuracy of prediction by the modified Grunn equation. Specifically, a conventional Grunn Equation utilizing a power n=1.75 predicted that an applied threshold cathode voltage ($V_{acc}$) approaching 3.5 keV would result in penetration of the electron beam radiation to a depth of ~3000 Å in CVD carbon-doped silicon oxide material having of density of 1.28 g/cm². However, under an applied energy or cathode voltage $V_{acc}$ of 3.5 keV, the underlying detection layer was actually observed to exhibit a shrinkage of 3.4%, in excess of the 2% predetermined maximum.

Use of the modified Grunn Equation having a power n=1.9 substantially improved the accuracy of prediction of the depth of electron beam penetration. Specifically, the modified Grunn equation predicted that a threshold applied cathode voltage ($V_{acc}$) of only slightly greater than 3.0 keV would result in penetration of the electron beam radiation to a depth of ~3000 Å in CVD carbon-doped silicon oxide material having of density of 1.28 g/cm².

In agreement with this prediction, under an applied $V_{acc}$ of 3.0 keV, the underlying detection layer was actually observed to exhibit a shrinkage of 1.7%, within the 2% predetermined maximum. Thus as also shown in FIG. 4, the optimal experimentally observed run #9 of TABLE 2 lies along the plot predicted by the modified Grunn Equation having a power n=1.9, rather than along the plot predicted by the conventional Grunn Equation having a power n=1.75.

Review of the film shrinkage data of TABLES 1 & 2 also reveals that both the predicted and observed depth of penetration of e-beam energy are relatively independent of the dose of the electron beam. For example, comparison of the data resulting from run nos. 5 and 7 of TABLE 1 indicated that a five-fold increase in electron beam dose resulted in only a slight increase in the shrinkage observed in the underlying layer. Similarly, only a minor correlation between e-beam penetration depth and dosage is observed by comparing the results of run nos. 9 and 11 of TABLE 2.

While the experimental results of TABLES 1 & 2 were obtained utilizing the n&k Analyzer 2000 available from n&k Technology, embodiments in accordance with the present invention are not limited to use of this particular device. In accordance with alternative embodiments, other apparatuses could be utilized to detect changes in the properties of irradiated film stacks. For example spectroscopic ellipsometers, such as Wollam or Sopra ellipsometers, could be utilized for this purpose.

And while the depth of electron beam penetration was revealed in TABLES 1 & 2 by detecting changed film thickness, this is not required by the present invention. In accordance with alternative embodiments, other changed physical properties of an underlying layer exhibiting enhanced sensitivity to received electron beam radiation, could alternatively be measured.

Once such alternative changed physical property which can be monitored is the composition of the material. In particular, interaction of carbon-doped silicon oxide with applied electron beam radiation results in the liberation of carbon, and hence the depletion of carbon from the film as-deposited. Because the carbon content of the films can accurately be measured utilizing secondary ion mass spectrometry (SIMS) techniques, carbon concentration of a treated carbon-doped dielectric film can be utilized as a marker for electron beam penetration.

Figure 5A:
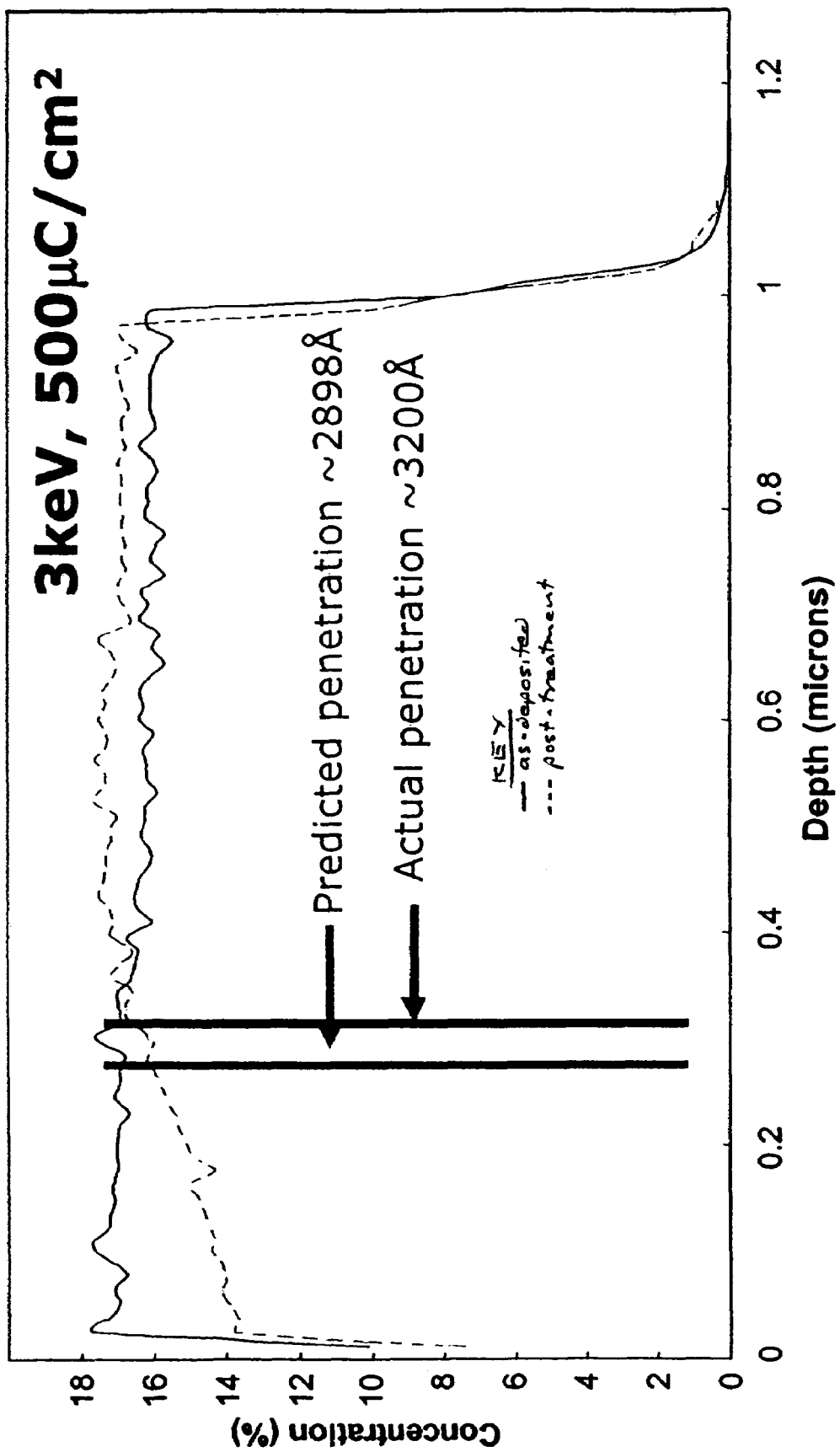
FIGS. 5A and 5B plots carbon concentration as a function of depth into a carbon-doped silicon oxide material as deposited, and following exposure to an electron beam applied with different energies.

FIG. 5A plots carbon concentration as a function of depth into a carbon-doped silicon oxide material as deposited, and following exposure to an electron beam applied with an energy of 3 keV and a dose of 500 μC/cm². FIG. 5A shows that based upon carbon-depletion SIMS studies, the actual depth of electron beam penetration differed from depth predicted by the conventional (n=1.75) Grunn equation by about 300 Å.

Figure 5B:
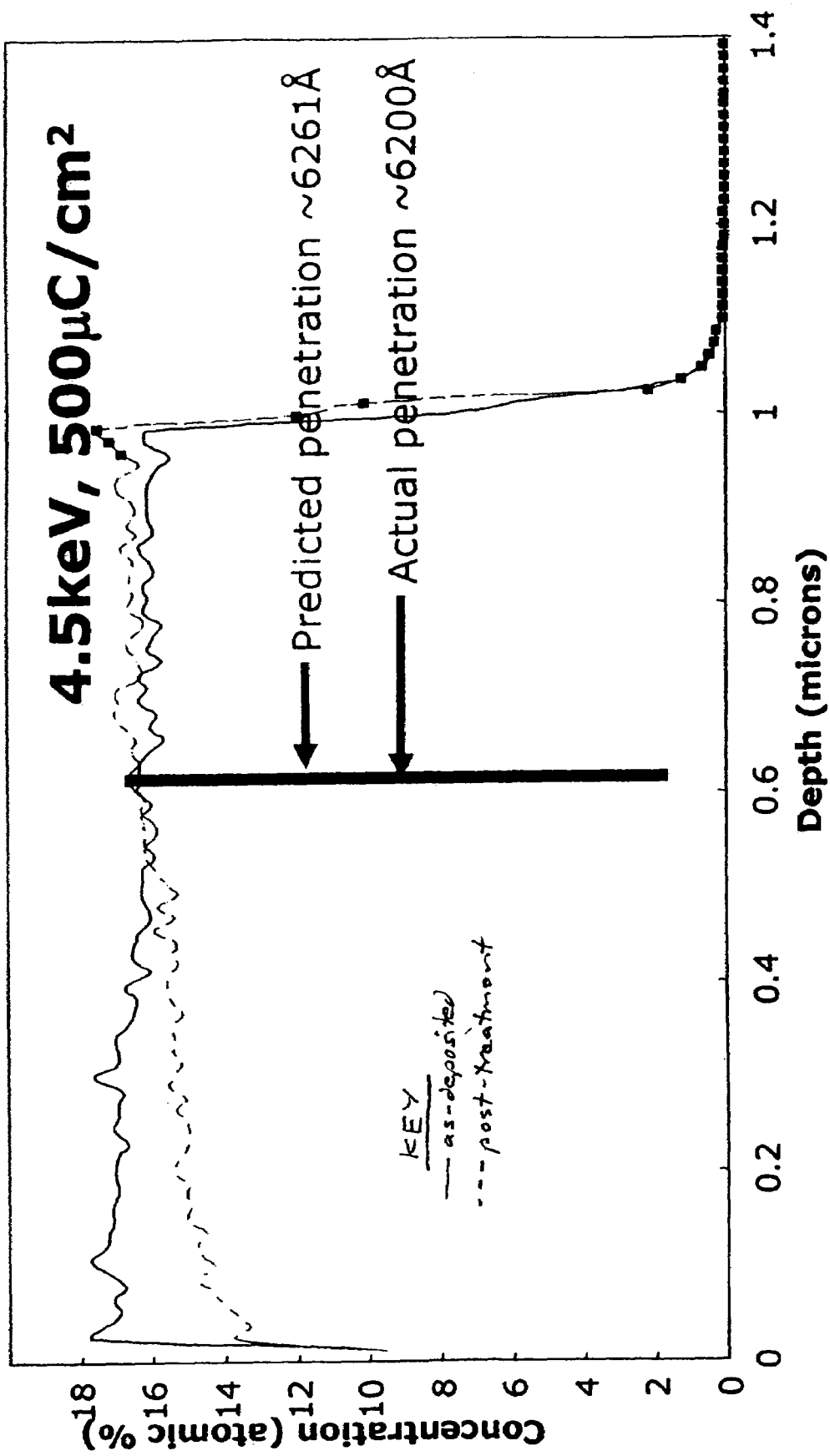

FIG. 5B plots carbon concentration as a function of depth into a carbon-doped silicon oxide material as deposited, and following exposure to an electron beam applied with an energy of 4.5 keV and a dose of 500 μC/cm². FIG. 5B shows that based upon carbon-depletion SIMS studies, the actual depth of electron beam penetration differed from depth predicted by the conventional (n=1.75) Grunn equation by about 60 Å.

Figure 5C:
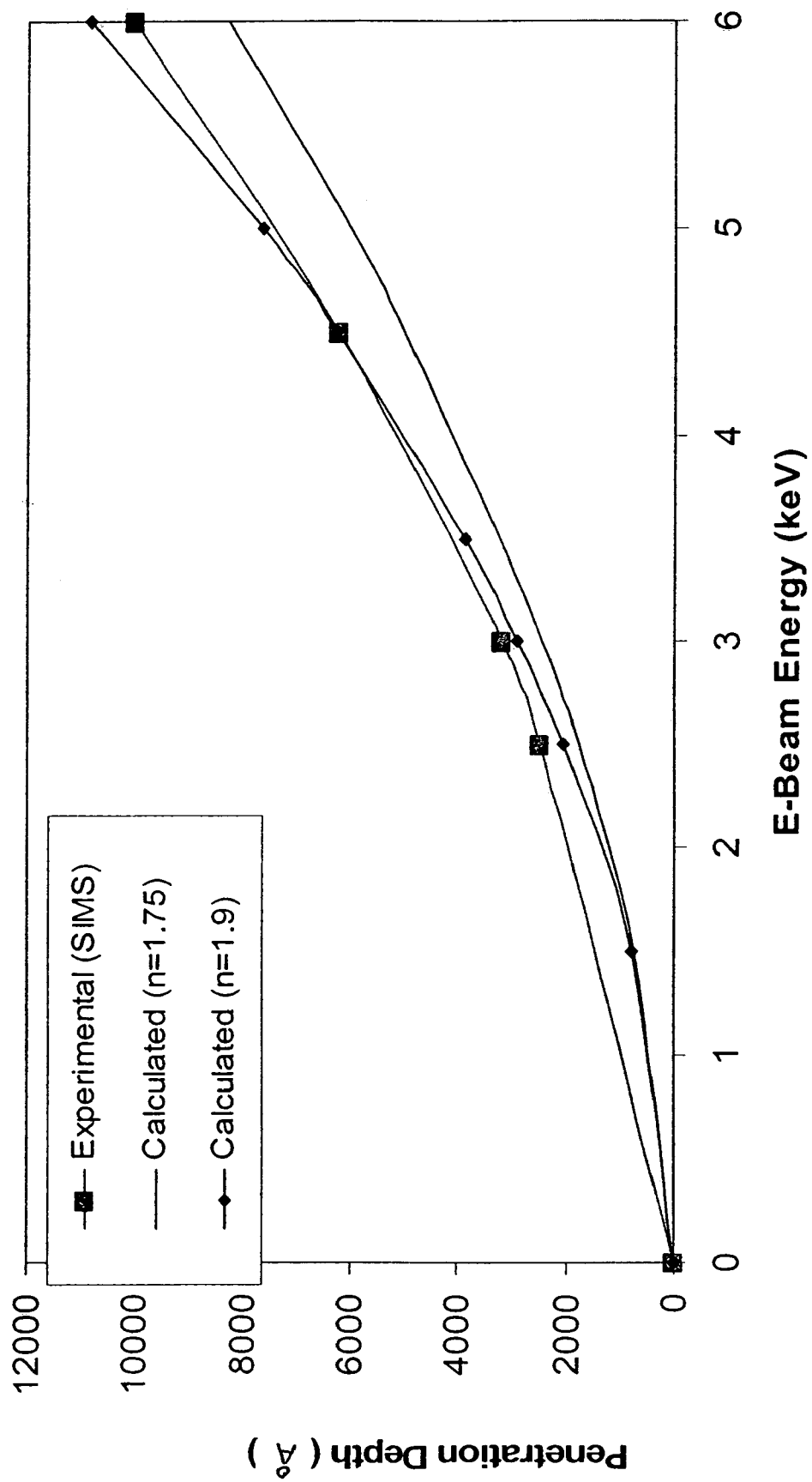
FIG. 5C plots predicted and observed electron beam penetration depth for a variety of different post-deposition processing runs.

FIG. 5C plots predicted and observed depth of electron beam penetration into a carbon doped silicon oxide film, based upon irradiation at the e-beam energy and dose shown in FIGS. 5A-B, and further including observed results based upon irradiation at 2.5 keV and 6 keV. FIG. 5C again shows that values predicted by the Grunn equation modified with n=1.9, more closely match experimentally observed results.

Figure 5D:
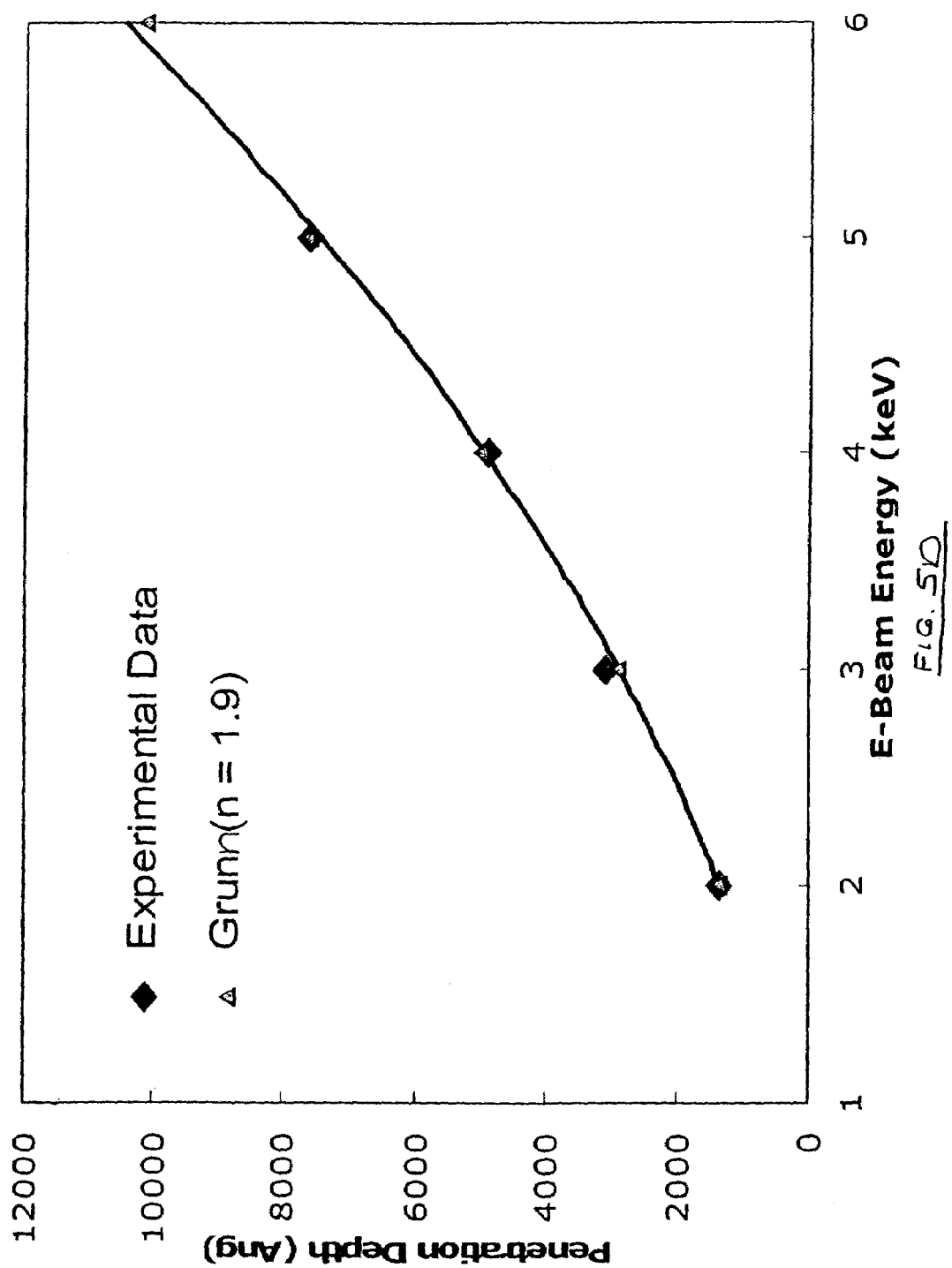
FIG. 5D plots predicted and observed electron beam penetration depth for a variety of different post-deposition processing runs.

FIG. 5D plots predicted and observed depth of electron beam penetration into a carbon doped silicon oxide film, based upon irradiation at the e-beam energies shown in TABLE 3.

TABLE 3

| E-Beam Energy (keV) | E-Beam Penetration Depth Experimentally Observed (Å) | E-Beam Penetration Depth Predicted by Grunn Equation Modified n = 1.9 (Å) |
| --- | --- | --- |
| 2 | 1361 | 1341 |
| 3 | 3087 | 2897 |
| 4 | 4905 | 5005 |
| 5 | 7620 | 7649 |
| 6 | — | 10141 |

FIG. 5D and TABLE 3 again show that values predicted by the Grunn equation modified with n=1.9, closely match the experimentally observed results.

While the above discussion described experimental determination of e-beam penetration depth based upon changed material composition in the form of carbon content, methods in accordance with the present invention are not limited to this specific embodiment. In accordance with alternative embodiments, changed concentrations of other than carbon in the detection layer could be utilized as a marker of e-beam penetration depth. Examples of such other film components whose concentration could be monitored to reveal e-beam penetration depth include, but are not limited to oxygen, hydrogen, and silicon.

Apart from film shrinkage and changed material composition, still other properties of underlying films could be monitored to reveal electron beam penetration depth. For example, in still further alternative embodiments, the refractive index (RI) could be measured.

TABLE 4 summarizes the change in RI experienced by the top layer of the thin film dielectric stacks exposed to a number of the processing runs listed in TABLES 1 & 2:

TABLE 4

| | Refractive Index (RI) of Top Layer | |
| --- | --- | --- |
| Run # | Pre-Treatment | Post-Treatment |
| 1 | 1.3549 | — |
| 2 | 1.3541 | 1.3538 |
| 3 | 1.3559 | 1.3816 |
| 4 | 1.3568 | 1.3991 |
| 5 | 1.3576 | 1.4186 |
| 6 | 1.3538 | 1.4267 |
| 8 | 1.3545 | 1.3803 |
| 9 | 1.3573 | 1.3924 |
| 10 | 1.3575 | 1.3997 |

In addition to changes in film thickness, material composition, refractive index, and dielectric constant, still other physical properties of underlying films could be monitored to reveal the depth of penetration of applied electron beam radiation. For example, U.S. patent application Ser. No. 10/302,375 ("the '375 application), entitled "Method For Curing Low Dielectric Constant Film By Electron Beam", was filed on Nov. 22, 2002 and is incorporated by reference herein for all purposes. The '375 application indicates that electron beam irradiation of certain carbon-doped silicon oxide films may liberate carbon porogens deposited there-with, creating nanopores and desirably reducing the dielectric constant of the irradiated film. Thus in accordance with alternative embodiments of the present invention, changes in dielectric constant of an underlying detection film could be monitored to mark the depth of penetration of an electron beam through an intervening target material of predetermined thickness and exhibiting reduced sensitivity to the incident electron beam radiation.

In addition to detecting changes in the physical properties specifically enumerated above, still other physical properties of a detection material could be monitored to reveal the depth of penetration of applied electron beam radiation. For example, mechanical properties including but not limited to hardness and modulus of elasticity (in GPa) of an underlying detection film, may be measured by the technique of nanoindentation, utilizing the NANO INDENTER® apparatuses available from MTS Systems Corp. of Eden Prairie, Minn. The mechanical properties of the underlying detection film can be measured after removing the top layer with various methods, such as etching. Still another property which could be measured to reveal electron beam penetration depth is film density.

Embodiments of apparatuses and methods for predicting electron beam exposure in accordance with the present invention may be employed in a variety of applications. One particular application for embodiments in accordance with the present invention is in the curing of deposited low K films to form ultra low K nanoporous films. U.S. Pat. No. 6,541,367, incorporated by reference herein for all purposes, describes one method of forming such a nanoporous film. The use of electron beam processing during this formation process is more fully described in the '375 application.

Embodiments in accordance with the present invention can alternatively be used in the application of electron beam validation for shadow mask lithography, or as a resist sensitivity tool.

Figure 6:
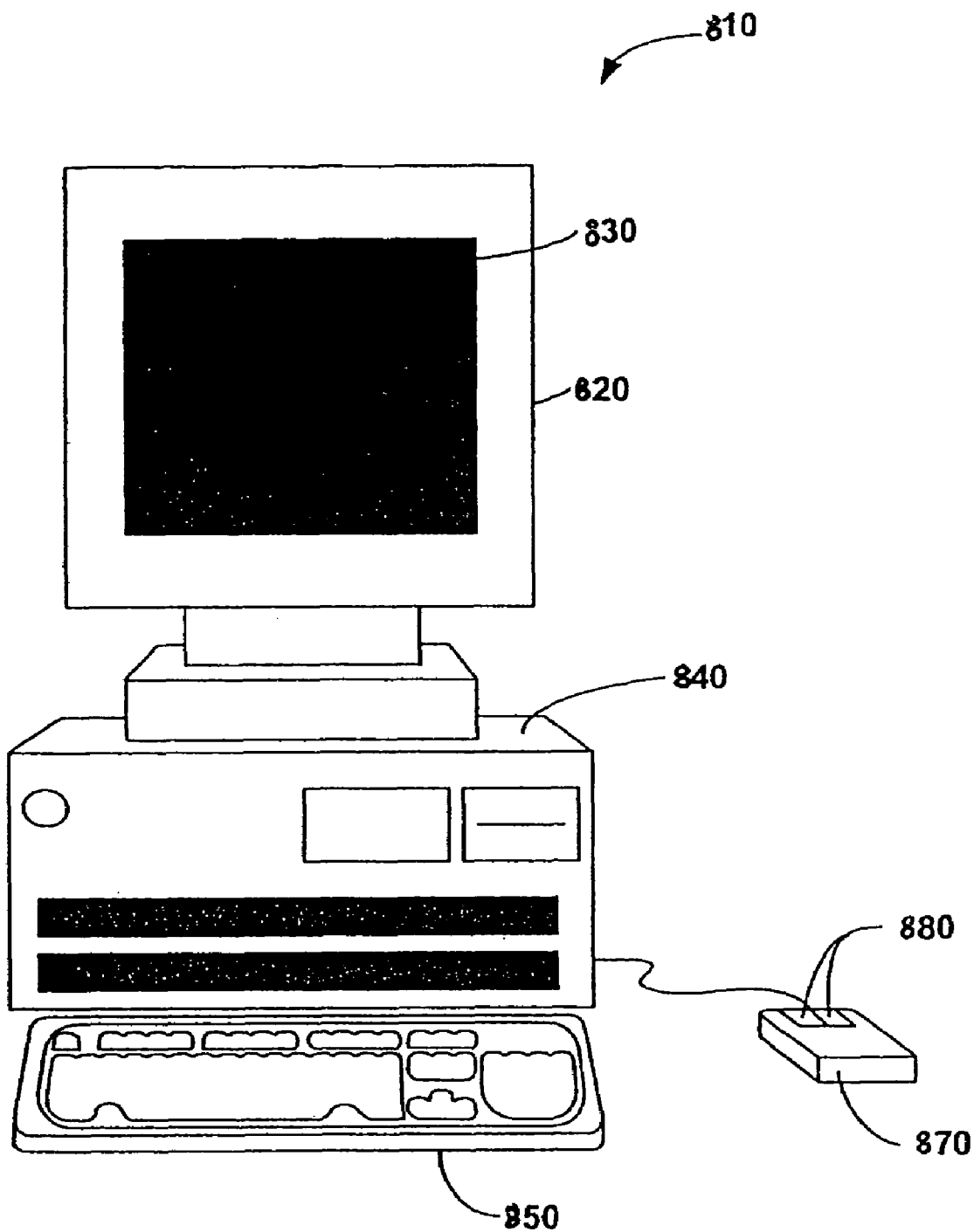
FIG. 6 is a schematic illustration of a host computer system for use in accordance with embodiments of the present invention.

As described in detail above, embodiments of methods in accordance with embodiments of the present invention are particularly suited for implementation in conjunction with a host computer system. FIG. 6 is a simplified diagram of a computing device for processing information according to an embodiment of the present invention. This diagram is merely an example which should not limit the scope of the claims herein. One of ordinary skill in the art would recognize many other variations, modifications, and alternatives. Embodiments according to the present invention can be implemented in a single application program such as a browser, or can be implemented as multiple programs in a distributed computing environment, such as a workstation, personal computer or a remote terminal in a client server relationship.

FIG. 6 shows computer system 810 including display device 820, display screen 830, cabinet 840, keyboard 850, and mouse 870. Mouse 870 and keyboard 850 are representative "user input devices." Mouse 870 includes buttons 880 for selection of buttons on a graphical user interface device. Other examples of user input devices are a touch screen, light pen, track ball, data glove, microphone, and so forth. FIG. 6 is representative of but one type of system for embodying the present invention. It will be readily apparent to one of ordinary skill in the art that many system types and configurations are suitable for use in conjunction with the present invention. In a preferred embodiment, computer system 810 includes a Pentium™ class based computer, running Windows™ NT operating system by Microsoft Corporation. However, the apparatus is easily adapted to other operating systems and architectures by those of ordinary skill in the art without departing from the scope of the present invention.

As noted, mouse 870 can have one or more buttons such as buttons 880. Cabinet 840 houses familiar computer components such as disk drives, a processor, storage device, etc. Storage devices include, but are not limited to, disk drives, magnetic tape, solid state memory, bubble memory, etc. Cabinet 840 can include additional hardware such as input/output (I/O) interface cards for connecting computer system 810 to external devices external storage, other computers or additional peripherals, further described below.

Figure 6A:
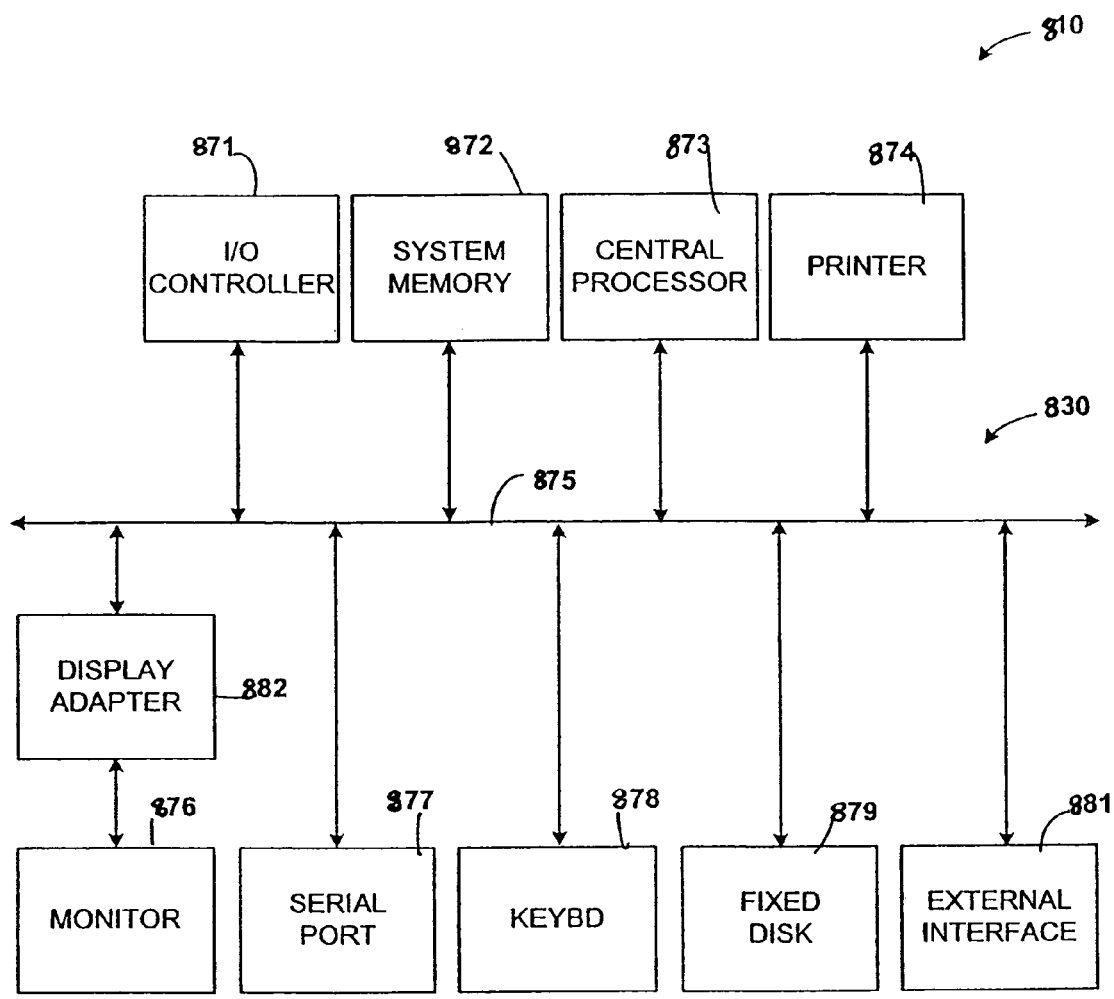
FIG. 6A is an illustration of basic subsystems the host computer system of FIG. 6.

FIG. 6A is an illustration of basic subsystems in computer system 810 of FIG. 6. This diagram is merely an illustration and should not limit the scope of the claims herein. One of ordinary skill in the art will recognize other variations, modifications, and alternatives. In certain embodiments, the subsystems are interconnected via a system bus 875. Additional subsystems such as a printer 874, keyboard 878, fixed disk 879, monitor 876, which is coupled to display adapter 882, and others are shown. Peripherals and input/output (I/O) devices, which couple to I/O controller 871, can be connected to the computer system by any number of means known in the art, such as serial port 877. For example, serial port 877 can be used to connect the computer system to a modem 881, which in turn connects to a wide area network such as the Internet, a mouse input device, or a scanner. The interconnection via system bus allows central processor 873 to communicate with each subsystem and to control the execution of instructions from system memory 872 or the fixed disk 879, as well as the exchange of information between subsystems. Other arrangements of subsystems and interconnections are readily achievable by those of ordinary skill in the art. System memory, and the fixed disk are examples of tangible media for storage of computer programs, other types of tangible media include floppy disks, removable hard disks, optical storage media such as CD-ROMS and bar codes, and semiconductor memories such as flash memory, read-only-memories (ROM), and battery backed memory.

Embodiments in accordance with the present invention may be implemented in conjunction with a host computer, utilizing a computer-readable storage medium having code recorded thereon for modifying the Grunn equation, and then utilizing the modified Grunn equation to predict depth of penetration of electron beam radiation into target material of varying thicknesses. Particular embodiments of the program code may include an input module receiving the experimentally observed density, penetration depth, and cathode voltage data, a processing module generating the numerical power "n" of the Grunn equation fitting this data, and an output data for providing a user with the generated power n. The program code may further include a prediction module utilizing the modified Grunn equation to calculate depth of penetration of an electron beam into the target material at different applied energies (cathode voltages).

Embodiments in accordance with the present invention may be implemented in conjunction with electron beam irradiation output from a variety of sources. U.S. Pat. No. 5,003,178, incorporated herein by reference for all purposes, describes a design for a large-area uniform electron source. The following additional U.S. patents, describing refinements of this device, are also hereby incorporated by reference: U.S. Pat. Nos. 5,468,595, 6,132,814, 6,204,201, 6,207,555, 6,271,146, 6,319,655, and U.S. Pat. No. 6,407,399.

Figure 2A:
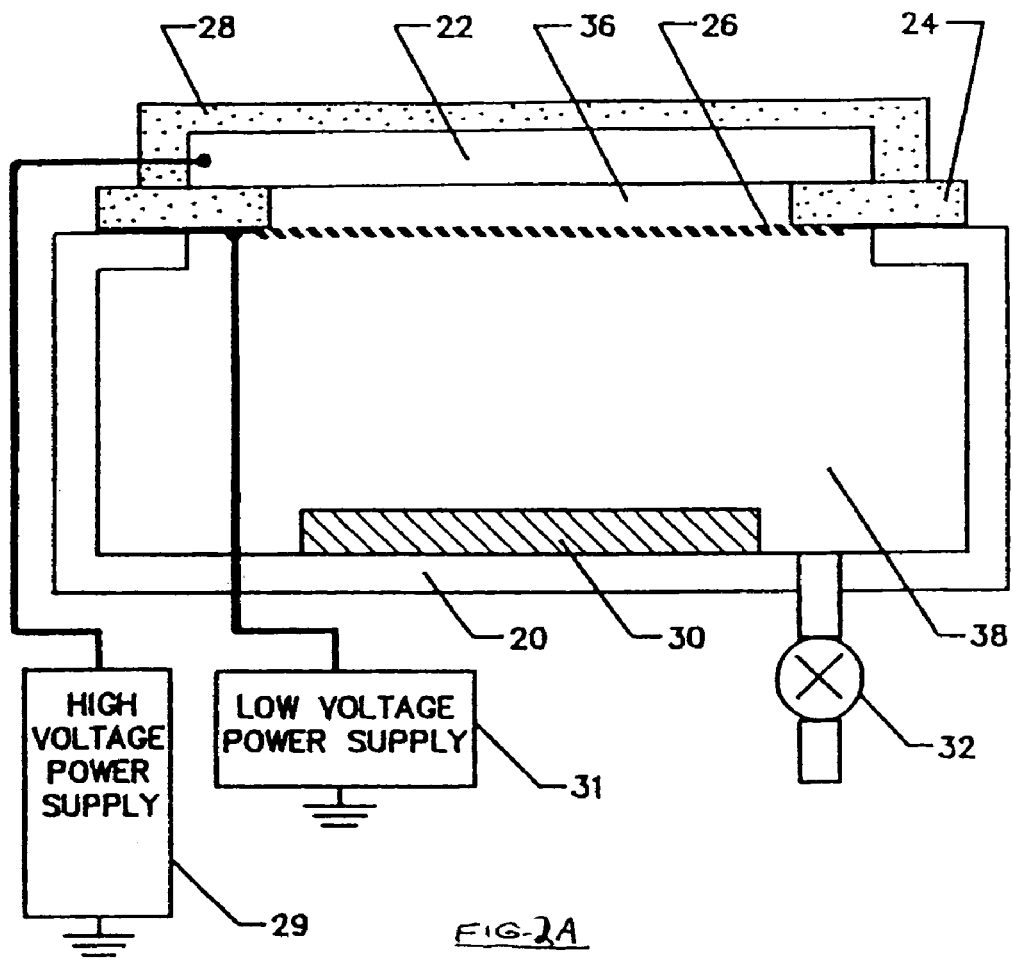
FIG. 2A is a simplified elevational view showing an electron beam exposure apparatus.

FIG. 2A shows a cross-sectional view of one embodiment of an apparatus for applying electron beam radiation in accordance with the present invention. Cold cathode gas discharge electron source includes a vacuum chamber, indicated by reference numeral 20, a large-area cathode 22, a target or substrate 30, located in a field-free region 38, and a grid (fine mesh screen) anode 26 placed between the target 30 and cathode 22, at a distance from the cathode that is less than the mean free path length of electrons emitted from the rent can be varied over a wide range by varying the bias voltage applied to the grid 26.

The apparatus of the invention further includes a high voltage insulator 24, which isolates the grid 26 from the large-area cathode 22, a cathode cover insulator 28 located outside the vacuum, a variable leak valve 32 for controlling the pressure inside the vacuum chamber 20, a variable high voltage power supply 29 connected to the cathode 22, and a variable low voltage 0 to 100 volt power supply 31 connected to the grid 26.

Figure 2B:
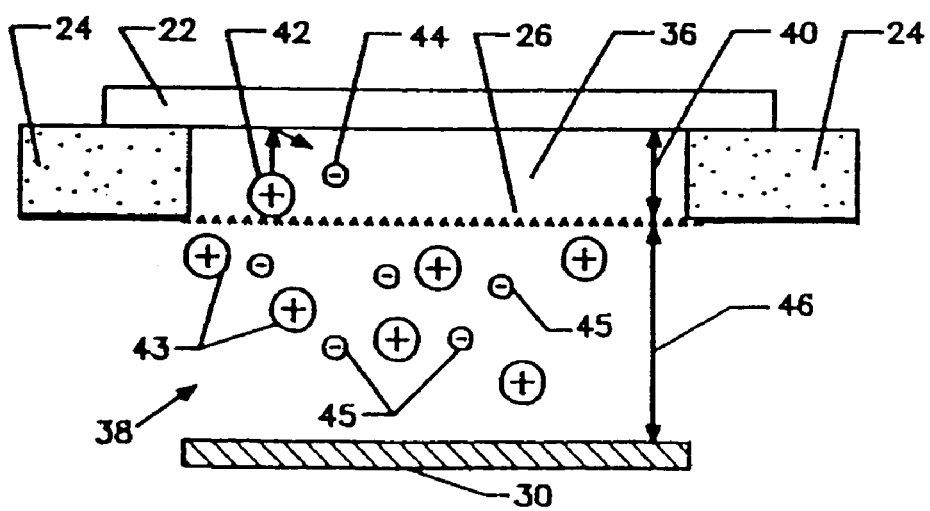
FIG. 2B is a fragmentary view similar to FIG. 2A, but also showing schematically some of the details of operation.

In operation of the apparatus of the invention, the substrate to be exposed with the electron beam is placed on the target plane 30, and the vacuum chamber 20 is pumped from atmospheric pressure to a pressure in the range of 1 to 200 millibar. The exact pressure is controlled via the variable rate leak valve 32, which is capable of controlling pressure to +/−1 millibar. The high voltage (negative voltage between 500 volts and 30,000 volts or higher) at which the exposure is to take place is applied to the cathode 22 via the high voltage power supply 29. A variable voltage source 31 (for example: a d.c. power supply capable of sourcing or sinking current) is also applied to the grid anode 26. The voltage on the grid is utilized to control electron emission from the cathode, as will now be described with reference to FIG. 2B.

To initiate electron emission, the gas in the space between the cathode 22 and the target 30 must become ionized. This transpires as a result of naturally occurring gamma rays, or emission can instead be initiated artificially inside the chamber by a high voltage spark gap. Once this initial ionization takes place, positive ions 43 are attracted to the grid 26 by a slightly negative voltage (0 to −80 volts) applied to the grid 26. These positive ions 42 pass into the accelerating field region 36 between the cathode 22 and the grid anode 26 and are accelerated towards the cathode surface 22 as a result of the high voltage applied to the cathode (−500 to −30,000 volts). Upon striking the cathode surface these high energy ions produce secondary electrons 44 which are accelerated back toward the grid 26. Some of these electrons, which are now traveling mostly perpendicular to the cathode surface, strike the grid (anode) structure 26 but many pass through the grid and continue on to the target 30. These high energy electrons ionize the gas molecules in the space between the grid 26 and the target 30.

The fine mesh grid 26 is placed at a distance less than the mean free path of the electrons emitted by the cathode. Therefore no significant ionization takes place in the accelerating field region 36 between the grid and the cathode. (In a conventional gas discharge device the electrons emitted would create further positive ions in the accelerating field region and all of these ions would be accelerated back to the cathode creating even more electron emission and the discharge could easily avalanche into an unstable high voltage breakdown.) However, in this invention, the ions 42 created outside the grid are controlled (repelled or attracted) by the voltage applied to the grid 26. Thus, the emission (electron beam current) can be continuously controlled (from very small currents to very large currents) by varying the voltage on the grid. Alternatively, the electron emission can be controlled by means of the variable leak valve 32, which can raise or lower the number of molecules in the ionization region between the target and cathode. However, due to the slow response time of adjusting the pressure in the chamber, it is more advantageous to adjust the pressure initially to produce some nominal emission current and then utilize the bias voltage on the grid 26 to rapidly and precisely control emission current.

The electron emission can be turned off entirely by applying a positive voltage to the grid 26, such that the positive grid voltage exceeds the energy of any of the positive ion species created in the space between the grid 26 and target 30. It has been found that the grid can be located a distance less than 4 mm from the cathode. This distance is less than the mean free path of electrons for the lowest voltage of interest (500 volts) and preferred operating vacuum pressure level. In the prior art practiced by Induni, he strived for a high vacuum in the accelerating field region to prevent breakdown.

Fortuitously, the preferred operating vacuum level of this invention is in the region of highest electrical dielectric strength. Therefore, even though the grid-to-cathode gap must by necessity be very small to be less than the mean free path determined by the lowest desired operating accelerating voltage, the system is operated at a vacuum level where the breakdown strength of the vacuum exceeds the field created by the highest operating voltage applied across the selected grid-to-cathode spacing. This low or soft vacuum level (20 to 80 millitorr) is easily achieved by inexpensive mechanical vacuum pumps and allows the cathode 22 and target 30 to be placed in close proximity to each other in the same vacuum environment.

Further, this mechanism of ion bombardment induced electron emission maintains a clean and uniform emitting cathode surface. Although this continual ion bombardment causes erosion of the cathode surface due to sputtering, by utilizing a low sputtering yield cathode material, such as aluminum, the cathode can be operated continuously for many thousands of hours without requiring replacement.

Figure 2C:
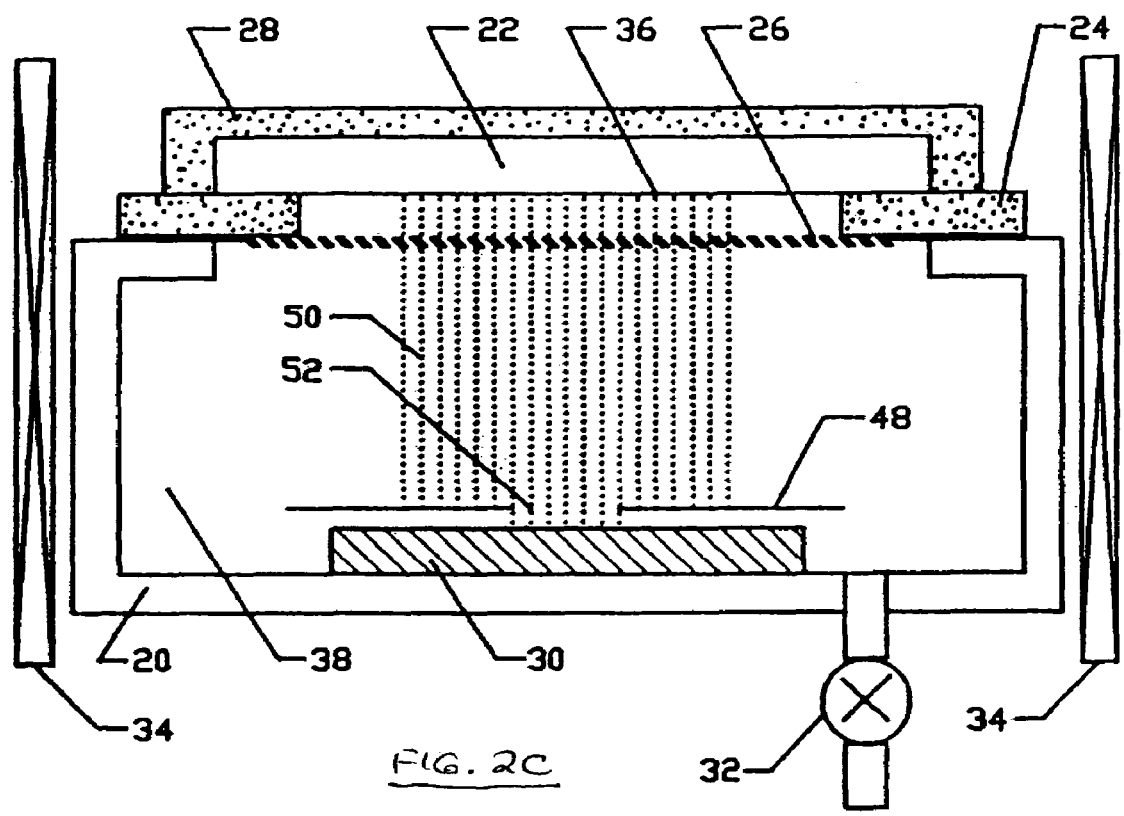
FIG. 2C is a view similar to FIG. 2A, but also showing use of the invention in shadow mask lithography.

The electrons emitted from the cathode 22 are accelerated to the grid 26 and are mostly traveling perpendicular to the grid and cathode surface. Some emitted electrons are intercepted by the grid and some are scattered by the grid. If the target 30 is within a few millimeters of the grid, the electrons will cast an image of the grid on the target. However, if the target is placed at a large distance 46, such as 10 to 20 centimeters from the grid, the electron beam diffuses (due to initial transverse velocities and scattering) to a fairly uniform current density across the whole emitting area. The irradiation of the target can be made even more uniform by sweeping the beam back and forth across the target by means of a time-varying magnetic field produced by deflection coils 34 surrounding the exposure chamber, as shown in FIG. 2C.

It will be appreciated from the foregoing that the present invention represents a vast improvement over other electron sources. In particular, the electron source of the invention provides a uniform, large-area beam of electrons at an easily controlled current level. Moreover, beam uniformity and beam current control are effective over a wide range of beam accelerating voltages, and under relatively poor vacuum conditions.

It will also be appreciated that, although various embodiments of the invention have been described in detail for purposes of illustration, various modifications may be made without departing from the spirit and scope of the invention. Accordingly, the invention is not to be limited except as by the appended claims.

Merely by way of example, the invention has been applied to reducing charge buildup in dielectric films that are exposed to radiation from large area electron beam sources. The method and structure can be applied to other applications including, but not limited to, the control of charge buildup in other materials, such as semiconductor materials, composite semiconductor/dielectric materials, and the like.

While the above is a complete description of specific embodiments of the present invention, various modifications, variations, and alternatives may be employed. These equivalents and alternatives are included within the scope of the present invention. Therefore, the scope of this invention is not limited to the embodiments described, but is defined by the following claims and their full scope of equivalents.

What is claimed is:

1. A method of determining a depth of penetration of an electron beam into a target material, the method comprising:
   providing an electron beam source;
   providing a layer of a detection material exhibiting a first sensitivity of a physical property in response to electron beam radiation;
   providing a layer of the target material of a first thickness in contact with the detection material and positioned proximate to the electron beam source, the target material exhibiting a second, reduced sensitivity of the physical property in response to electron beam radiation;
   directing electron beam radiation at a first energy into the target material; and
   detecting a change in the physical property of the detection material to mark an observed electron beam penetration depth of the first thickness.

2. The method of claim 1 further comprising calculating a numerical power (n) of the Grunn Equation:

$$\text{Depth} = \frac{0.046 \ (V_{acc})^n}{\rho}.$$

resulting based upon a density (ρ) of the target material, the first energy (Vacc), and the observed electron beam penetration depth (Depth).

3. The method of claim 2 further comprising:
   providing a second layer of the target material of a second thickness in contact with a second layer of the detection material and positioned proximate to the electron beam source;
   directing electron beam radiation of a second energy into the second target material layer;
   sensing a change in the physical property of the second detection material layer to reveal a second observed electron beam penetration depth of the second thickness; and
   confirming the calculated numerical power (n) of the Grunn equation by fitting the target material density (ρ), the second energy (Vacc), and the second thickness (Depth).

4. The method of claim 1 wherein a changed thickness of the detection layer is sensed.

5. The method of claim 4 wherein the changed detection layer thickness is sensed utilizing spectroscopic ellipsometry.

6. The method of claim 1 wherein a changed composition of the detection layer is sensed.

7. The method of claim 1 wherein a change in one of a density, a mechanical property, a refractive index, and a dielectric constant of the detection layer is sensed.

8. The method of claim 1 wherein providing the target material comprises chemical vapor depositing a carbon-doped silicon oxide film.

9. The method of claim 8 wherein exposure of the target material to the electron beam liberates a porogen.

10. The method of claim 1 wherein providing the detection material comprises providing a carbon-doped silicon oxide film.

11. The method of claim 10 wherein exposure of the detection material to the electron beam reduces a carbon concentration in the detection material.

12. A method of predicting depth of penetration of an electron beam into a target material, the method comprising:
   providing a thickness of a target material layer in contact with a detection material layer and positioned proximate to the electron beam source, the target material exhibiting a second, reduced sensitivity of a physical property in response to electron beam radiation;
   successively irradiating the target material with electron beam radiation of increasing energies;
   identifying a threshold energy of the applied electron beam radiation resulting in a change of the physical property of the detection layer below a predetermined value;
   calculating a numerical power (n) of the Grunn Equation:

$$\text{Depth} = \frac{0.046 \ (V_{acc})^n}{\rho}$$

based upon the density (ρ), the threshold energy (Vacc), and the thickness (Depth); and
   utilizing the Grunn Equation with the calculated numerical power (n) to predict a second depth of penetration into the target material of an electron beam of a second energy.

13. The method of claim 12 wherein at least one of a thickness, composition, density, mechanical property, refractive index, and dielectric constant of the detection layer is changed in the detection layer by the electron beam radiation.

14. The method of claim 12 wherein providing the target material comprises providing a carbon-doped silicon oxide film.

15. The method of claim 14 wherein providing the detection material comprises providing a different carbon doped silicon oxide film, and the predetermined value comprises a shrinkage of 2% or less of the different carbon doped silicon oxide film.

16. A composition for indicating depth of penetration of an electron beam, the composition comprising:
   a detection material exhibiting a first sensitivity of a physical property in response to an electron beam radiation exposure dosage; and
   a target material in contact with the detection material and positioned proximate to a source of electron beam radiation, the target material exhibiting a second, reduced sensitivity of the physical property in response to the electron beam radiation exposure dosage.

17. The composition of claim 16 wherein the detection material exhibits greater shrinkage than the target material in response to the exposure dosage.

18. The composition of claim 16 wherein the detection material comprises carbon doped silicon oxide.

19. The composition of claim 18 wherein the detection material exhibits a greater reduction in carbon content than the target material in response to the exposure dosage.

20. The composition of claim 18 wherein the detection material exhibits a greater reduction in dielectric constant than the target material in response to the exposure dosage.

21. A computer-readable storage medium having a computer-readable program embodied therein for directing operation of a host computer including a communications system, a processor, and a storage device, wherein the computer-readable program includes instructions for operating the host computer to calculate a numerical power n of a Grunn Equation in accordance with the following:

receiving a thickness (Depth) of a target material in contact with a detection material and positioned proximate to the electron beam source, the target material exhibiting a reduced sensitivity of a physical property in response to electron beam radiation, receiving a density ($\rho$) of the target material, receiving a threshold energy of applied electron beam radiation (Vacc) resulting in a change of a physical property of a detection layer below a predetermined value; and calculating a numerical power (n) of the Grunn Equation:

$$\text{Depth} = \frac{0.046 \, (V_{acc})^n}{\rho}$$

based upon the density, the threshold energy, and the thickness.

22. The computer-readable storage medium of claim 21 further including instructions to utilize the calculated numerical power (n) to predict a second depth of penetration into the target material of an electron beam having a second energy.

* * * * *